US006804288B2

(12) United States Patent
Haraguchi (10) Patent No.: US 6,804,288 B2
(45) Date of Patent: Oct. 12, 2004

(54) ELECTRON BEAM EXPOSURE APPARATUS AND ELECTRON BEAM DEFLECTION APPARATUS

(75) Inventor: Takeshi Haraguchi, Tokyo (JP)

(73) Assignee: Advantest Corporation, Tokyo (JP)

( * ) Notice: Subject to any disclaimer, the term of this patent is extended or adjusted under 35 U.S.C. 154(b) by 19 days.

(21) Appl. No.: 10/422,304

(22) Filed: Apr. 23, 2003

(65) Prior Publication Data

US 2003/0183778 A1 Oct. 2, 2003

Related U.S. Application Data

(63) Continuation of application No. PCT/JP02/00226, filed on Jan. 16, 2002.

(30) Foreign Application Priority Data

Jan. 18, 2001 (JP) .......................................... 2001-010817

(51) Int. Cl.[7] ........................ H01J 37/305; B23K 15/00; A61N 5/00
(52) U.S. Cl. ...................... 373/10; 373/14; 219/121.12; 250/492.2
(58) Field of Search .................. 373/10–14; 219/121.11, 219/121.12, 121.18, 121.19; 250/396 R, 396 ML, 392.2, 398; 396/611; 355/53, 72

(56) References Cited

U.S. PATENT DOCUMENTS

| 3,622,741 A | * | 11/1971 | Steigerwald ................... 373/14 |
| 4,198,569 A | * | 4/1980 | Takayama ................. 250/492.2 |
| 5,023,462 A | * | 6/1991 | Yamada et al. ........... 250/492.2 |
| 5,650,628 A | * | 7/1997 | Gordon et al. .............. 250/398 |
| 2004/0075822 A1 | * | 4/2004 | Hattori |

FOREIGN PATENT DOCUMENTS

| JP | 04-179116 | 6/1992 |
| JP | 05-266789 | 10/1993 |
| JP | 2000-003690 | 1/2000 |
| JP | 2001-284230 | 10/2001 |
| JP | 2001-345259 | 12/2001 |

* cited by examiner

Primary Examiner—Tu Ba Hoang
(74) Attorney, Agent, or Firm—Morrison & Foerster LLP (57) ABSTRACT

An electron beam exposure apparatus for exposing a pattern to a wafer by a plurality of electron beams, comprising an electron beam generating section for generating a plurality of electron beams, a deflecting section having a plurality of deflectors for deflecting the plurality of electron beams, and a screening section having a first screen electrode disposed between the plurality of deflectors and extending from a position close to the electron beam generating section from one end of the deflector to a position close to the wafer from one end of the deflector along the direction of radiation of electron beams.

15 Claims, 9 Drawing Sheets

ELECTRON BEAM EXPOSURE APPARATUS AND ELECTRON BEAM DEFLECTION APPARATUS

The present application is a continuation application of PCT/JP02/00226 filed on Jan. 16, 2002, claiming priority from a Japanese patent application No. 2001-10817 filed on Jan. 18, 2001, the contents of which are incorporated herein by reference.

BACKGROUND OF THE INVENTION

1. Field of the Invention

The present invention relates to an electron beam exposure apparatus and an electron beam deflection apparatus.

2. Description of the Related Art

Figure 1:
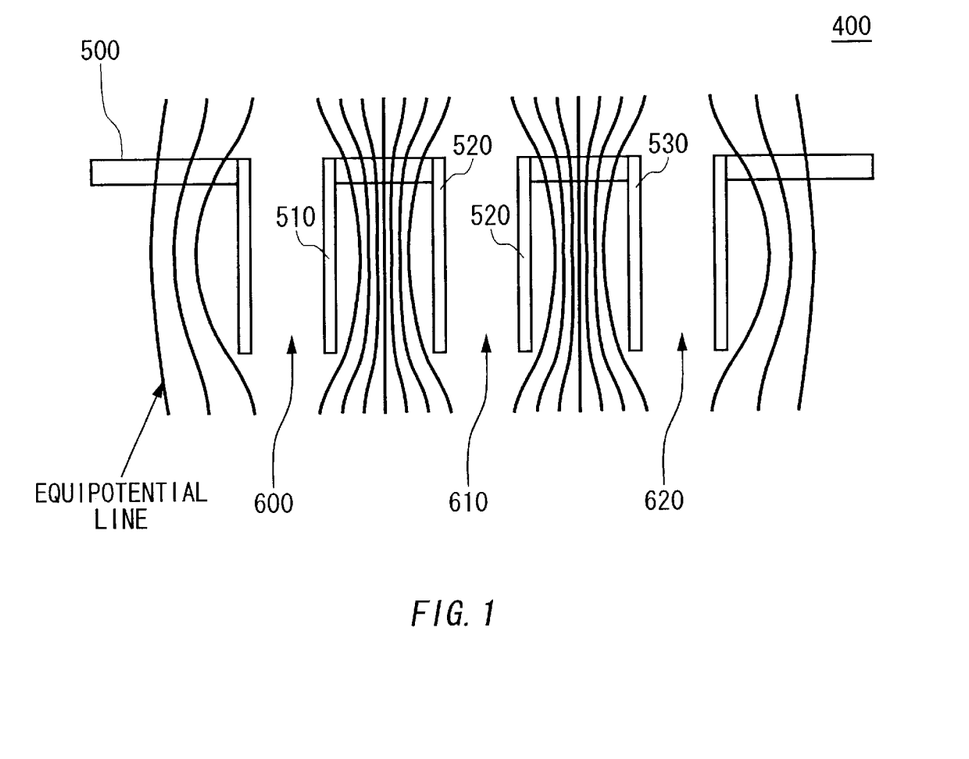
FIG. 1 is a configuration of an electron beam deflection apparatus according to a conventional electron beam exposure apparatus.

FIG. 1 is a diagram showing a configuration of an electron beam deflection apparatus 400 according to a conventional electron beam exposure apparatus. The electron beam deflection apparatus 400 includes a substrate 500, apertures 600, 610, and 620 provided in the substrate 500, and deflectors 510, 520, and 530 provided at the apertures 600, 610 and 620 respectively. In the electron beam deflection apparatus 400, the electron beams which pass through the apertures 600, 610, and 620 are independently deflected by applying voltage to deflecting electrodes of the deflectors 510, 520, and 530.

However, in the electron beam deflection apparatus 400 including the plurality of deflectors 510, 520, and 530, there is a problem that an electric field generated by a predetermined deflector affects electron beam other than the electron beam which passes through a predetermined deflector. For example, negative voltage is applied to the deflecting electrode of the deflector 510 so that the electron beam which passes through the aperture 600 is to be deflected, while positive voltage is applied to the deflecting electrode of the deflector 530 so that the electron beam which passes through the aperture 620 is to be deflected. Moreover, voltage is not applied to the deflecting electrode of the deflector 520 in order to let the electron beam, which passes through the aperture 610, go straight. However, as shown in FIG. 1, an electric field is generated on the orbit of the electron beam which passes through the deflector 520 due to an electric potential difference between the deflector 510 and the deflector 530, and the electron beam which passes through the deflector 520 is deflected in a direction of the deflector 530 to which the positive electric potential is applied.

SUMMARY OF THE INVENTION

Accordingly, it is an object of the present invention to provide an electron beam exposure apparatus and an electron beam deflection apparatus which can solve the foregoing problem. The object can be achieved by combinations described in the independent claims. The dependent claims define further advantageous and exemplary combinations of the present invention.

In order to solve the foregoing problem, according to the first aspect of the present invention, there is provided an electron beam exposure apparatus for exposing a pattern on a wafer by a plurality of electron beams. The electron beam exposure apparatus includes: an electron beam generating section for generating the plurality of electron beams; a deflecting section including a plurality of deflectors for deflecting the plurality of electron beams respectively; and a screening section including a first screen electrode provided between the plurality of deflectors along an irradiation direction of the electron beam, wherein a distance between an upper end of the first screen electrode and the electron beam generating section is shorter than a distance between a distal end of the deflectors and the electron beam generating section, and a distance between a lower end of the first screen electrode and the wafer is shorter than a distance between the distal end of the deflectors and the wafer.

The first screen electrode may have a gridiron shape, where each of the plurality of deflectors are provided between bars of the grid. The first screen electrode may be provided at circumference of each of the plurality of deflectors.

The deflecting section may be provided in a direction substantially perpendicular to the irradiation direction of the electron beams, and may further include a deflector substrate at which the plurality of deflectors are provided, and the first screen electrode may be attached on the deflector substrate.

The first screen electrode may be provided so that a distance between an upper end of the first screen electrode and the electron beam generating section is shorter than a distance between a distal end of the deflector and the electron beam generating section, and a distance between a lower end of the first screen electrode and the wafer 44 is shorter than a distance between the distal end of the deflectors and the wafer.

The deflecting section may be provided in a direction substantially perpendicular to the irradiation direction of the electron beam, and may further include a deflector substrate at which the plurality of deflectors are provided, and the screening section may be provided substantially parallel with the deflector substrate, and may further include a first screening substrate on which the first screen electrode is attached.

The screening section may include: a second screen electrode provided across the deflector substrate from the first screen electrode along the irradiation direction of the electron beams; and a second screening substrate provided across the deflector substrate from the first screening substrate in a direction substantially parallel with the deflector substrate. The second screen electrode may be attached on the second screening substrate.

The first screen electrode may include a plurality of apertures in a direction substantially perpendicular to the irradiation direction of the electron beams. The first screen electrode may be a grid electrode.

The electron beam exposure apparatus may further include an electron lens section for focusing the plurality of electron beams independently. The electron lens section may include: a first magnetic conductor with a plurality of first apertures through which the plurality of electron beams pass; and a second magnetic conductor with a plurality of second apertures through which each of the plurality of electron beams, which has passed through each of the first apertures, passes, where the second magnetic conductor is provided substantially parallel with the first magnetic conductor. The deflector may be provided inside the first aperture, and the first screen electrode may be provided between the first magnetic conductor and the second magnetic conductor.

The electron beam exposure apparatus may further include an electron lens section for focusing the plurality of electron beams independently. The electron lens section may include: a first magnetic conductor with a plurality of first apertures through which the plurality of electron beams pass; and a second magnetic conductor with a plurality of second apertures through which each of the plurality of electron beams, which has passed through each of the first apertures, passes, where the second magnetic conductor is provided substantially parallel with the first magnetic conductor. The deflector may be provided inside the first aperture. The first screen electrode may provided between the plurality of second apertures of the second magnetic conductor extending from the second magnetic conductor to a direction of the wafer. The screening section may further include: a second screen electrode provided between the plurality of first apertures of the first magnetic conductor extending from the first magnetic conductor to a direction of the electron beam generating section; and a third screen electrode provided between the plurality of first apertures and between the first magnetic conductor and the second magnetic conductor, extending along the irradiation direction of the electron beams.

The screening section may include: a first screening substrate, which is provided substantially parallel with the second magnetic conductor, on which the first screen electrode is attached; and a second screening substrate, which is provided substantially parallel with the first magnetic conductor, on which the second screen electrode is attached.

According to the second aspect of the present invention, there is provided an electron beam deflection apparatus for independently deflecting a plurality of electron beams. The electron beam deflection apparatus includes: a substrate in which a plurality of apertures are provided; a plurality of deflectors provided in each of the plurality of apertures of the substrate; and a first screen electrode provided between the plurality of apertures of the substrate.

The deflector may be provided on the substrate and extending along a first direction which is a direction substantially perpendicular to the substrate, and the first screen electrode may be provided on the substrate and extending along the first direction, wherein the first screen electrode is longer than the deflector.

The electron beam deflection apparatus may further include a second screen electrode provided across the substrate from the first screen electrode along the first direction.

This summary of invention does not necessarily describe all necessary features so that the invention may also be a sub-combination of these described features.

DETAILED DESCRIPTION OF THE INVENTION

The invention will now be described based on the embodiments hereinafter, which do not intend to limit the scope of the present invention as defined in the appended claims. All of the features and the combinations thereof described in the embodiments are not necessarily essential to the invention.

Figure 2:
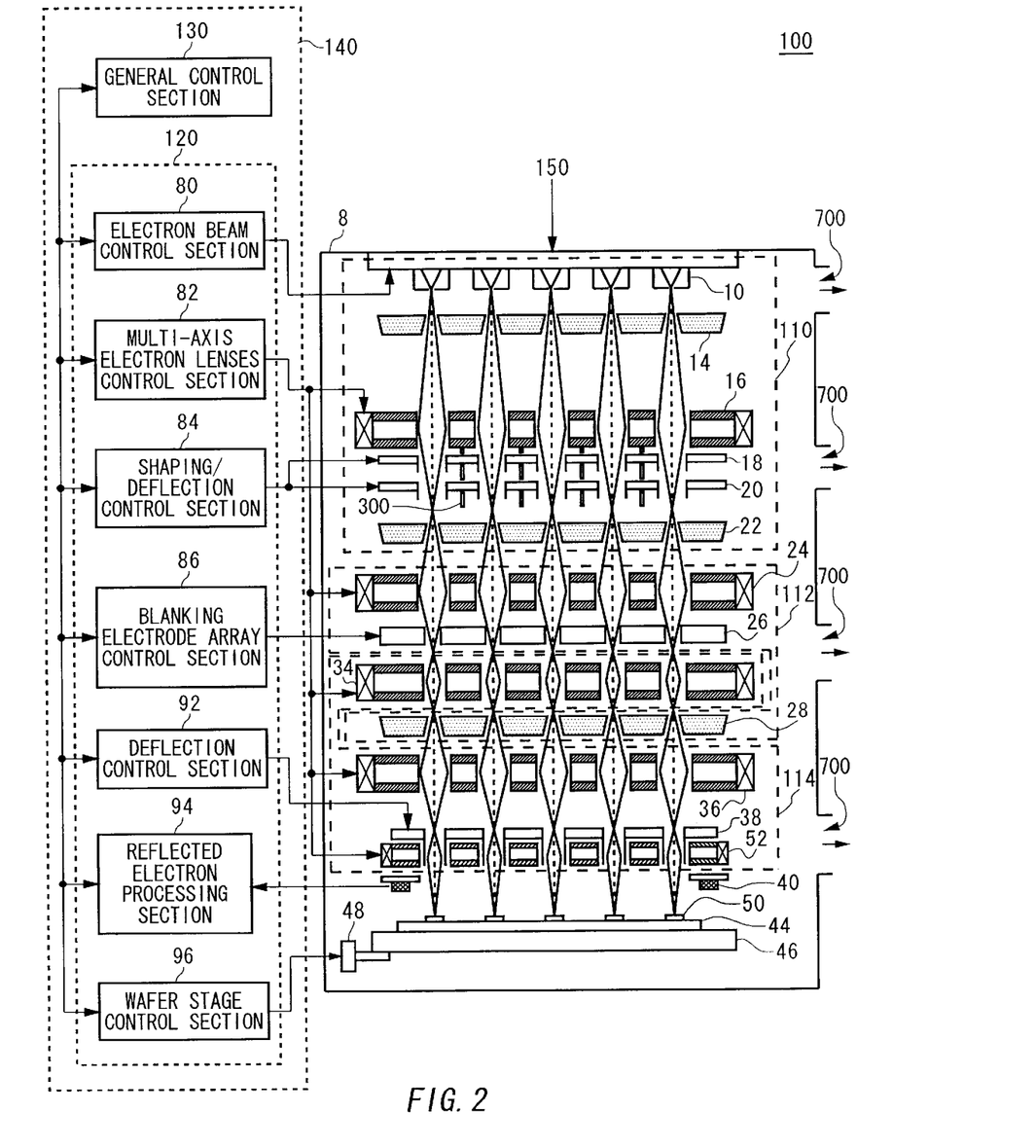
FIG. 2 is a configuration of an electron beam exposure system according to an embodiment of the present invention.

FIG. 2 is a diagram showing a configuration of an electron beam exposure system 100 according to an embodiment of the present invention. The electron beam exposure system 100 includes an exposure section 150 for performing a predetermined wafer exposure processing using an electron beam, and a control system 140 for controlling operation of each composition of the exposure section 150.

The exposure section 150 includes: electron beam shaping means 110 for generating a plurality of electron beams inside a case 8, and for shaping cross-sectional shapes of the electron beams into desired shapes; irradiation selecting means 112 for selecting whether each of the electron beams is to be irradiated on a wafer 44 independently; and an electron optics system including a wafer projection system 114 for adjusting direction and size of a pattern image which is irradiated on the wafer 44. Moreover, the exposure section 150 includes a wafer stage 46 on which the wafer 44 to be exposed is mounted, and a wafer stage drive section 48 for driving the wafer stage 46. Furthermore, the exposure section 150 includes an electron detector 40 for detecting such as secondary electrons and reflected electrons emitted from a mark section due to the electron beam irradiated on the mark section 50, which is provided on the wafer 44 or the wafer stage 46. The electron detector 40 detects the electrons emitted from the mark section and outputs a detection signal in accordance with the amount of the detected electrons to a reflected electron processing section 94.

The electron beam shaping means 110 includes: an electron beam generating section 10 for generating a plurality of electron beams; a first shaping member 14 and a second shaping member 22 with a plurality of apertures for shaping cross-sectional shapes of the irradiated electron beams by letting the electron beams pass through the apertures; a first multi-axis electron lens 16 for focusing the plurality of electron beams independently, and for adjusting focal points of the plurality of electron beams; a first shaping/deflection section 18 and a second shaping/deflection section 20 for independently deflecting the plurality of electron beams which pass the first shaping member 14; and a screening section 300 provided between a plurality of deflectors of the first shaping/deflection section 18 and the second shaping/deflection section 20.

The irradiation selecting means 112 includes: a second multi-axis electron lens 24 for focusing the plurality of electron beams independently, and for adjusting focal points of the plurality of electron beams; a blanking-electrode array 26 for selecting whether each of the electron beam is to be irradiated on the wafer 44 by deflecting a plurality of electron beams independently; an electron beam blocking member 28, which includes a plurality of apertures through which the electron beams pass, for blocking the electron beams deflected by the blanking-electrode array 26. In another example, the blanking-electrode array 26 is a blanking aperture array device.

The wafer projection system 114, includes: a third multi-axis electron lens 34 for focusing the plurality of electron beams independently, and reducing irradiation diameters of the electron beams; a fourth multi-axis electron lens 36 for focusing the plurality of electron beams independently, and adjusts focal points of the plurality of electron beams; a deflecting section 38 for independently deflecting each of the plurality of electron beams into a desired position on the wafer 44; a screening section provided between the plurality of deflectors of the deflecting section 38; and a fifth multi-axis electron lens 52, which functions as an objective lens to the wafer 44, for focusing the plurality of electron beams independently.

The control system 140 includes an individual control section 120 and a general control section 130. The individual control section 120 includes an electron beam control section 80, a multi-axis electron lenses control section 82, a shaping/deflection control section 84, a blanking electrode array control section 86, a deflecting control section 92, a reflected electron processing section 94, and a wafer stage control section 96. For example, the general control section 130 is a work station, and collectively controls each control section of the individual control section 120.

The electron beam control section 80 controls the electron beam generating section 10. The multi-axis electron lenses control section 82 controls the current supplied to the first multi-axis electron lens 16, the second multi-axis electron lens 24, the third multi-axis electron lens 34, the fourth multi-axis electron lens 36, and the fifth multi-axis electron lens 52. The shaping/deflection control section 84 controls the first shaping deflector 18 and the second shaping deflector 20. The blanking electrode array control section 86 controls voltage applied to deflecting electrodes of the blanking-electrode array 26. The deflection control section 92 controls voltage applied to deflecting electrodes of a plurality of deflectors of the deflecting section 38. The reflected electron processing section 94 outputs the detected signal output from an electron detector of the electron detector 40 to the general control section 130. The wafer stage control section 96 controls the wafer stage drive section 48, and moves the wafer stage 46 to a predetermined position. Moreover, the electron beam exposure apparatus 100 further includes a plurality of exhaust ports 700 provided in the case 8, and pressure reduction means connected to the exhaust ports 700 for reducing the pressure inside the case 8. The pressure reduction means maintains the pressure inside the case 8 at a pressure lower than atmospheric pressure.

Operation of the electron beam exposure system 100 according to the present embodiment will be explained hereinafter. First, the electron beam generating section 10 generates a plurality of electron beams. The first shaping member 14 shapes the plurality of electron beams, which is generated by the electron beam generating section 10 and irradiated on the first shaping member 14, by letting the electron beams pass through a plurality of apertures provided in the first shaping member 14. In alternate example, the plurality of electron beams are generated by further including means for dividing an electron beam generated by the electron beam generating section 10 into a plurality of electron beams.

The first multi-axis electron lens 16 independently focuses each of the plurality of electron beams, which is shaped into rectangular shape, and independently adjusts focal point of each of the electron beams to the second shaping member 22. The first shaping deflector 18 independently deflects the plurality of electron beams, which are shaped into rectangular shapes by the first shaping member, so that the plurality of electron beams are irradiated on desired positions of the second shaping member 22.

The second shaping deflector 20 deflects the plurality of electron beams deflected by the first shaping deflector 18 in substantially perpendicular direction to the second shaping member 22, and irradiates them on the second shaping member 22. Then the second shaping member 22, which includes a plurality of apertures having rectangular shapes, further shapes the plurality of electron beams, which have rectangular cross-sectional shapes and are irradiated on the second shaping member 22, into the electron beams having desired cross-sectional shapes for irradiating them on the wafer 44.

The second multi-axis electron lens 24 independently focuses the plurality of electron beams, and independently adjusts the focal point of each of the electron beams to the blanking-electrode array 26. Then, the plurality of electron beams, of which the focal points are adjusted by the second multi-axis electron lens 24, respectively pass through a plurality of apertures of the blanking-electrode array 26.

The blanking electrode array control section 86 controls whether or not the voltage is applied to the deflecting electrodes provided in the vicinity of each of the apertures of the blanking-electrode array 26. The blanking-electrode array 26 selects whether or not each of the electron beams are irradiated on the wafer 44 based on the voltage applied to each of the deflecting electrodes.

The electron beam which is not deflected by the blanking-electrode array 26 passes through the third multi-axis electron lens 34. Then the third multi-axis electron lens 34 reduces the diameter of the electron beam which passes through the third multi-axis electron lens 34. The reduced electron beam passes through an aperture of the electron beam blocking member 28. Moreover, the electron beam blocking member 28 blocks the electron beam deflected by the blanking-electrode array 26. The electron beam which has passed through the electron beam blocking member 28 enters the fourth multi-axis electron lens 36. Then, the fourth multi-axis electron lens 36 independently focuses each of the entered electron beams, and respectively adjusts the focal point of each of the electron beams to the deflecting section 38. The electron beam, of which the focal point is adjusted by the fourth multi-axis electron lens 36, enters the deflecting section 38.

The deflection control section 92 controls a plurality of deflectors of the deflecting section 38, and independently deflects each of the electron beams, which enters the deflecting section 38, into the position where it is to be irradiated on the wafer 44. The fifth multi-axis electron lens 52 adjusts the focal point of each of the electron beams to the wafer 44 which passes through the fifth multi-axis electron lens 52. Then, each of the electron beams, having the cross-sectional shape which is to be irradiated on the wafer 44, is irradiated on a desired position of the wafer 44, where it is to be irradiated.

During the exposure processing, it is preferable that the wafer stage drive section 48 continuously moves the wafer stage 46 to a predetermined direction based on a direction from the wafer stage control section 96. Then, according to the movement of the wafer 44, a desired circuit pattern is exposed on the wafer 44 by shaping the cross-sectional shape of each of the electron beams to the shapes which are to be irradiated on the wafer 44, by selecting the apertures, which allow the passage of the electron beams which are to be irradiated on the wafer 44, and by deflecting each of the electron beams so that it is irradiated on the desired position of the wafer 44.

Figure 3A:
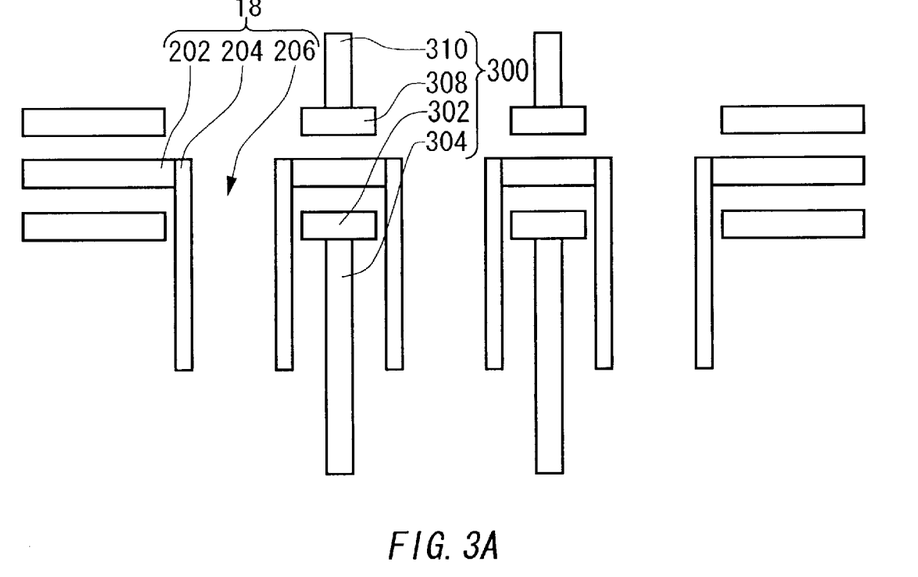
FIGS. 3A and 3B are configurations of a first shaping/deflection section and a screening section, respectively.
Figure 3B:
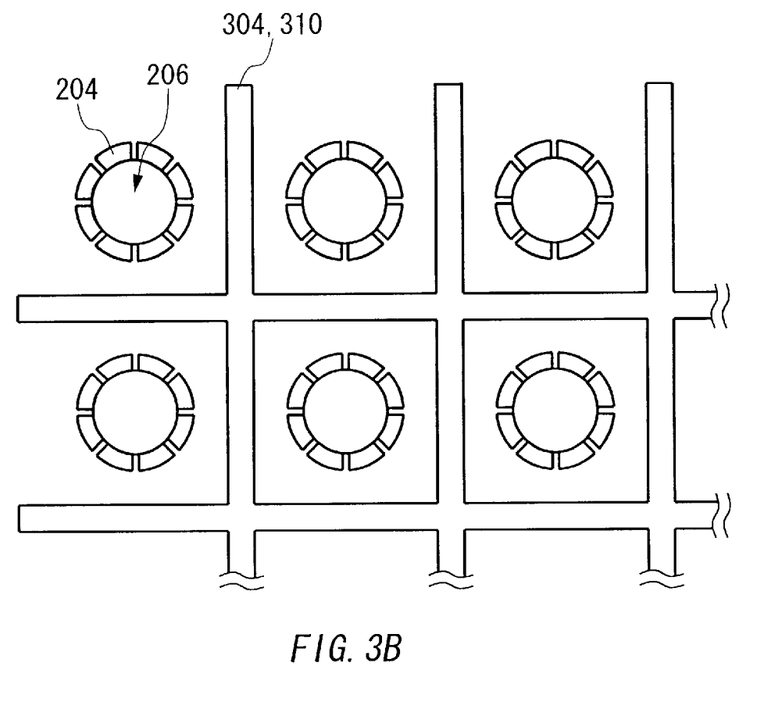

FIG. 3 is a schematic view showing a configuration of the first shaping/deflection section 18 and the screening section 300. FIG. 3A is a cross section of the first shaping/deflection section 18 and the screening section 300. FIG. 3B is a top view of the first shaping/deflection section 18 and the screening section 300. It is preferable that the second shaping/deflection section 20 and the blanking-electrode array 26 have the same configuration as that of the first shaping/deflection section 18, although the configuration of the first shaping/deflection section 18 will be explained hereinafter.

The first shaping/deflection section 18 includes: a deflector substrate 202 provided in a direction substantially perpendicular to the irradiation direction of the electron beams; apertures 206 provided in the deflector substrate 202; and deflectors 204 provided at each of the apertures 206 along the irradiation direction of the electron beams. Moreover, the screening section 300 includes: a first screening substrate 302 provided in a direction substantially perpendicular to the irradiation direction of the electron beams; a first screen electrode 304 provided on the first screening substrate 302 along the irradiation direction of the electron beams; a second screening substrate 308 provided across the deflector substrate 202 from the first screening substrate 302 in a direction substantially perpendicular to the irradiation direction of the electron beams; and a second screen electrode 310 provided on the second screening substrate 308 along the irradiation direction of the electron beams.

It is preferable that the first screen electrode 304 is provided along the irradiation direction of the electron beams between the plurality of deflectors 204. It is also preferable that a distance between the upper end of the first screen electrode 304 and the electron beam generating section 10 (refer to FIG. 2) is shorter than a distance between a distal end of the deflectors 204 and the electron beam generating section 10, and a distance between the lower end of the first screen electrode 304 and the wafer 44 (refer to FIG. 2) is shorter than a distance between the distal end of the deflectors 204 and the wafer 44. It is also preferable that the first screen electrode 304 is grounded. It is also preferable that the second screen electrode 310 is provided across the deflector substrate 202 from the first screen electrode along the irradiation direction of the electron beam. It is also preferable that the second screen electrode 310 is grounded. Moreover, as shown in FIG. 3B, it is also preferable that the first screen electrode 304 and the second screen electrode 310 have a gridiron shape, where each of the plurality of deflectors 204 are provided between bars of the grid.

Figure 4:
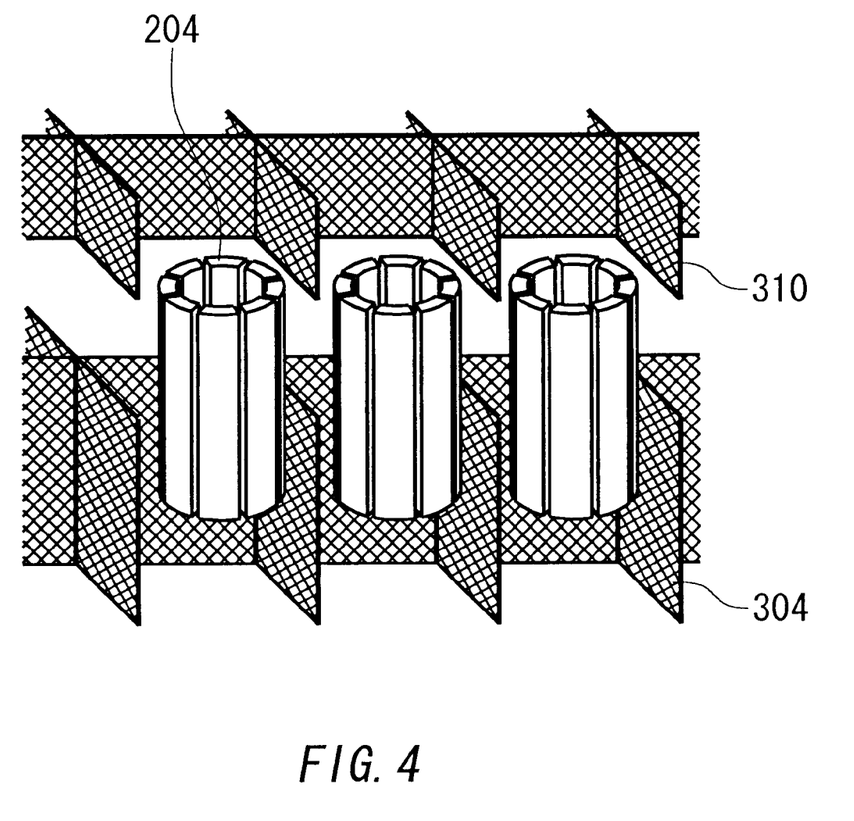
FIG. 4 is a configuration of a first screen electrode and a second screen electrode.

FIG. 4 is a view illustrating a configuration of the first screen electrode 304 and the second screen electrode 310. It is preferable that the first screen electrode 304 and the second screen electrode 310 include a plurality of apertures in the direction substantially perpendicular to the irradiation direction of the electron beams. As shown in FIG. 4, it is also preferable that the first screen electrode 304 and the second screen electrode 310 are grid electrodes. The interference to the electron beams by an electric field generated by the plurality of deflectors can be prevented without lowering the conductance of the evacuation of the case 8 by providing the apertures in the first screen electrode 304 and the second screen electrode 310 which are provided inside the case 8.

Figure 5A:
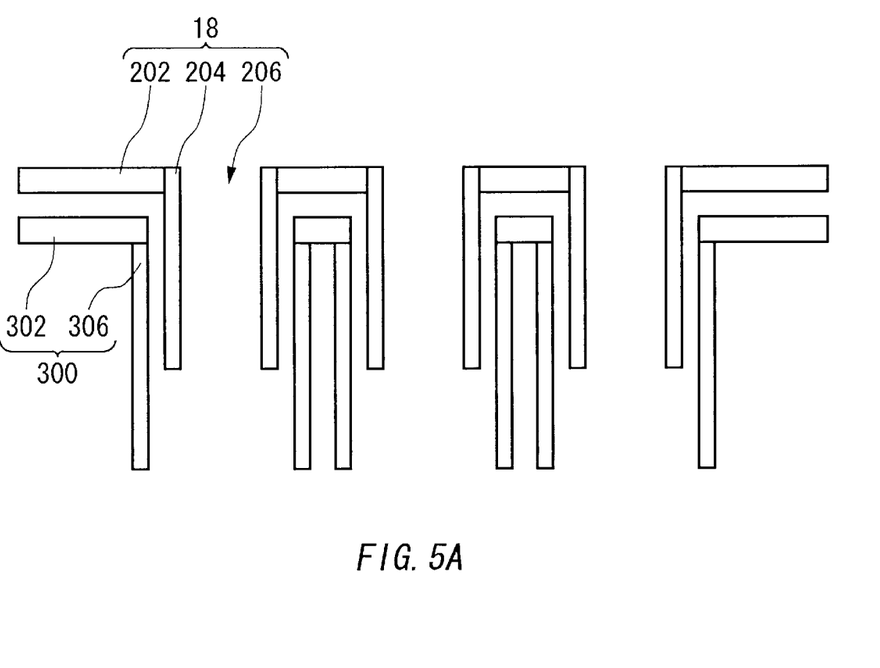
FIGS. 5A and 5B show another example of the configuration of the first shaping/deflection section and the screening section, respectively.
Figure 5B:
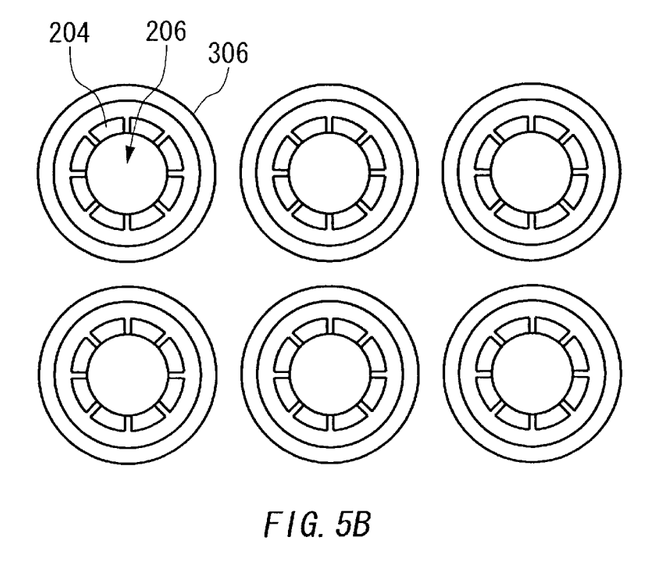

FIGS. 5A and 5B show another example of a configuration of the first shaping/deflection section 18 and a screening section 300. As shown in FIGS. 5A and 5B, each of tubular first screen electrodes 306 is provided at circumference of each of the plurality of deflectors 204. Moreover, the screen electrode may have any shape so long as the screen electrode screens the electric field generated by a predetermined first shaping/deflection section 18 and another first shaping/deflection section 18 lest the electric field generated by the predetermined first shaping/deflection section 18 should affect electron beams other than the electron beam which passes through the aperture 206 of the predetermined first shaping/deflection section 18.

Figure 6:
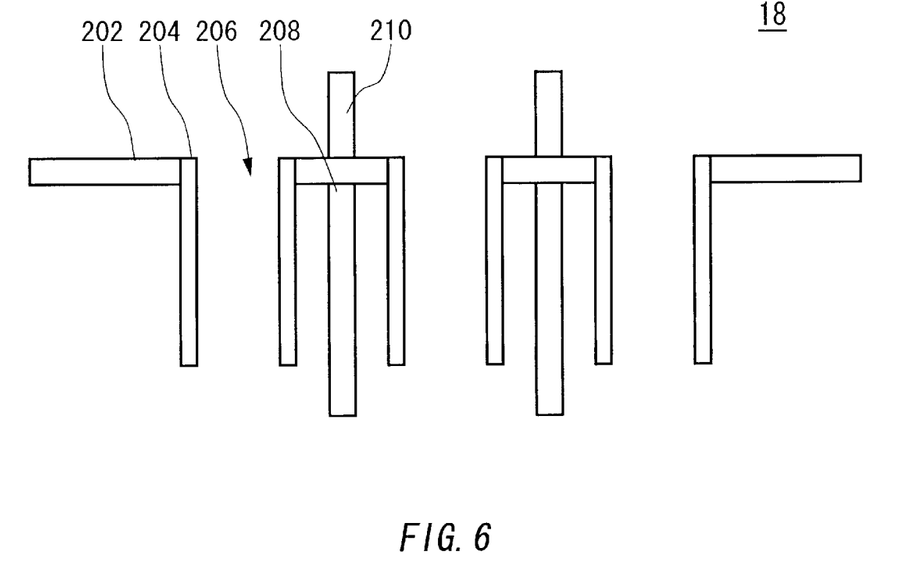
FIG. 6 is another example of the configuration of the first shaping/deflection section.

FIG. 6 shows another example of a configuration of the first shaping/deflection section 18. As shown in FIG. 6, the first shaping/deflection section 18 according to the present example includes: a deflector substrate 202 provided in a direction substantially perpendicular to the irradiation direction of the electron beams; apertures 206 provided in the deflector substrate 202; deflectors 204 provided at each of the apertures 206 along the irradiation direction of the electron beams; and a first screen electrode 208 provided between each of the plurality of apertures 206; and the second screen electrode 210 provided across the deflector substrate 202 from the first screen electrode 208 in the direction substantially perpendicular to the deflector substrate 202. The deflector 204 is provided on the deflector substrate 202 and extending along a first direction which is a direction substantially perpendicular to the deflector substrate 202. It is preferable that the first screen electrode 208 is provided along the first direction from the deflector substrate 202. It is preferable that the first screen electrode 208 is longer than the deflector 204. The first screen electrode 208 and the second screen electrode 210 have gridiron shapes and provided between each of the plurality of apertures 206. Alternatively, the first screen electrode 208 and the second screen electrode 210 are provided at circumference of each of the plurality of apertures 206. Furthermore, the first screen electrode 208 and the second screen electrode 210 include a plurality of apertures in the direction substantially perpendicular to the deflector substrate 202. It is also preferable that the first screen electrode 208 and the second screen electrode 210 are grid electrodes. Moreover, the first screen electrode 208 and the second screen electrode 210 are provided on upper and lower surfaces of the deflector substrate 202, and between each of the plurality of apertures.

Figure 7A:
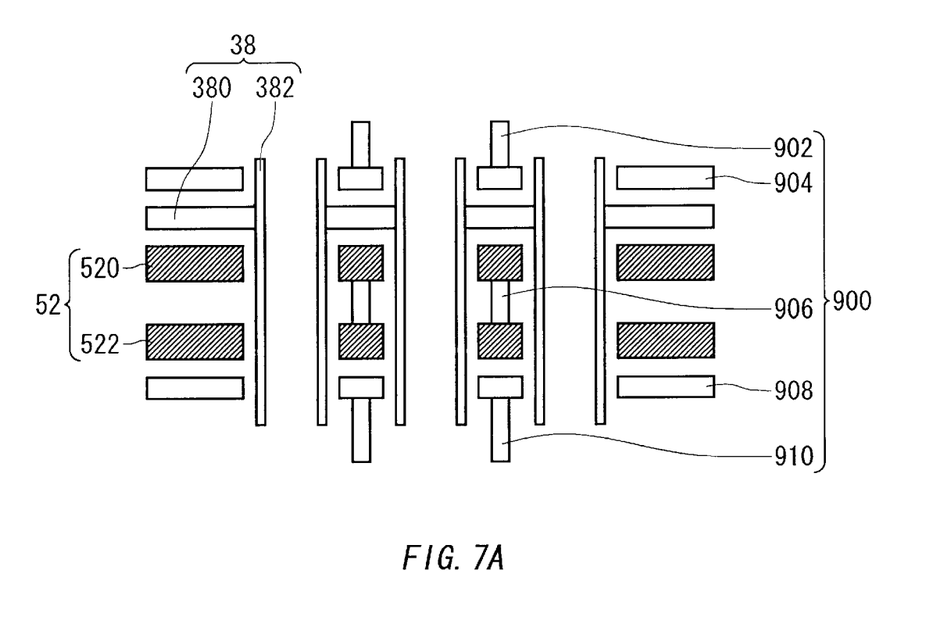
FIGS. 7A and 7B are configurations of a deflecting section, a fifth multi-axis electron lens and a screening section.

FIGS. 7A and 7B show a configuration of the deflecting section 38, a fifth multi-axis electron lens 52, and a screening section 900. More specifically, as shown in FIG. 7A, the deflecting section 38 includes a deflector substrate 380 and a plurality of deflectors 382 provided in the interior of lens apertures of the fifth multi-axis electron lens 52. Moreover, the fifth multi-axis electron lens 52 includes: a first magnetic conductor 520 with a plurality of first apertures through which a plurality of electron beams pass; and a second magnetic conductor 522 with a plurality of second apertures through which each of the plurality of electron beams, which has passed through each of the first apertures, passes, where the second magnetic conductor 522 is provided substantially parallel with the first magnetic conductor 520. Moreover, the screening section 900 includes: a first screen electrode 902 provided on the first magnetic conductor 520 and extending to a direction of the electron beam generating section 10 (refer to FIG. 2); a first screening substrate 904 provided substantially parallel with the first magnetic conductor 520 on which the first screen electrode is attached; a second screen electrode 910 provided on the second magnetic conductor 522 and extending to a direction of the wafer 44 (refer to FIG. 2); a second screening substrate 908 provided substantially parallel with the second magnetic conductor 522 on which the second screen electrode 910 is attached; and a third screen electrode 906 provided between the first magnetic conductor 520 and the second magnetic conductor 522.

Figure 7B:
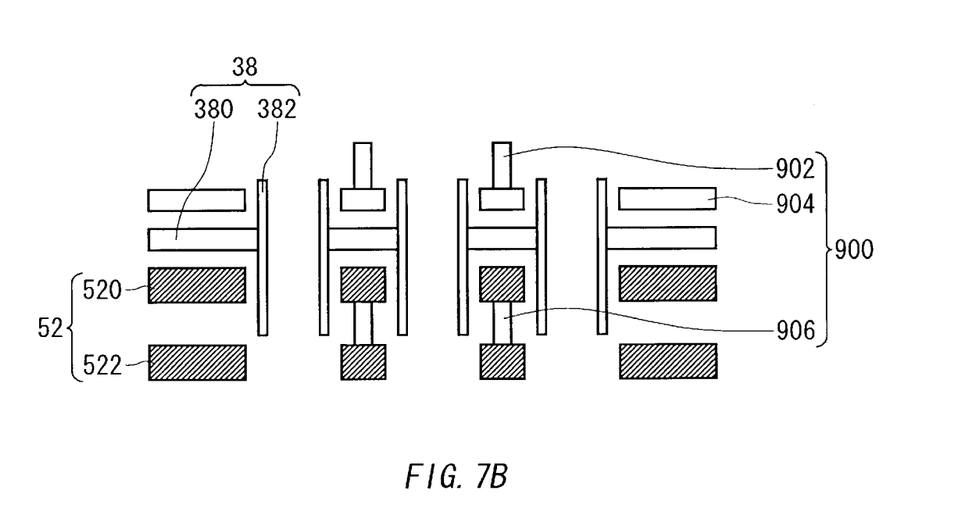

Alternatively, the first screen electrode 902, the second screen electrode 910, and the third screen electrode 906 have gridiron shapes so that each of the plurality of lens apertures is provided between the bars of the grid. Alternatively, the first screen electrode 902, the second screen electrode 910, and the third screen electrode 906 are provided at circumference of each of the plurality of lens apertures. Alternatively, the first screen electrode 902, the second screen electrode 910, and the third screen electrode 906 include a plurality of apertures in the direction substantially perpendicular to the deflector substrate 380. It is also preferable that the first screen electrode 902, the second screen electrode 910, and the third screen electrode 906 are grid electrodes. Alternatively, the screening section 900 does not include the first screening substrate 904, and the first screen electrode 902 is attached on the deflector substrate 380. Alternatively, the screening section 900 does not include the second screening substrate 908, and the second screen electrode 910 is attached on the second magnetic conductor 522. Alternatively, as shown in FIG. 7B, when the deflector 382 does not protrude from the second magnetic conductor 522 to a direction of the wafer 44 (refer to FIG. 2), the second screen electrode 910 is omitted.

It is also preferable that the deflector 382 is provided inside the aperture of the first screening substrate 904. That is, it is preferable that the deflector 382 is provided so that a distance between the upper end of the deflector 382 and the electron beam generating section 10 (refer to FIG. 2) is shorter than a distance between the first screening substrate 904 and the electron beam generating section 10, and a distance between the lower end of the deflector 382 and the wafer 44 (refer to FIG. 2) is shorter than a distance between the first screening substrate 904 and the wafer 44.

Figure 8:
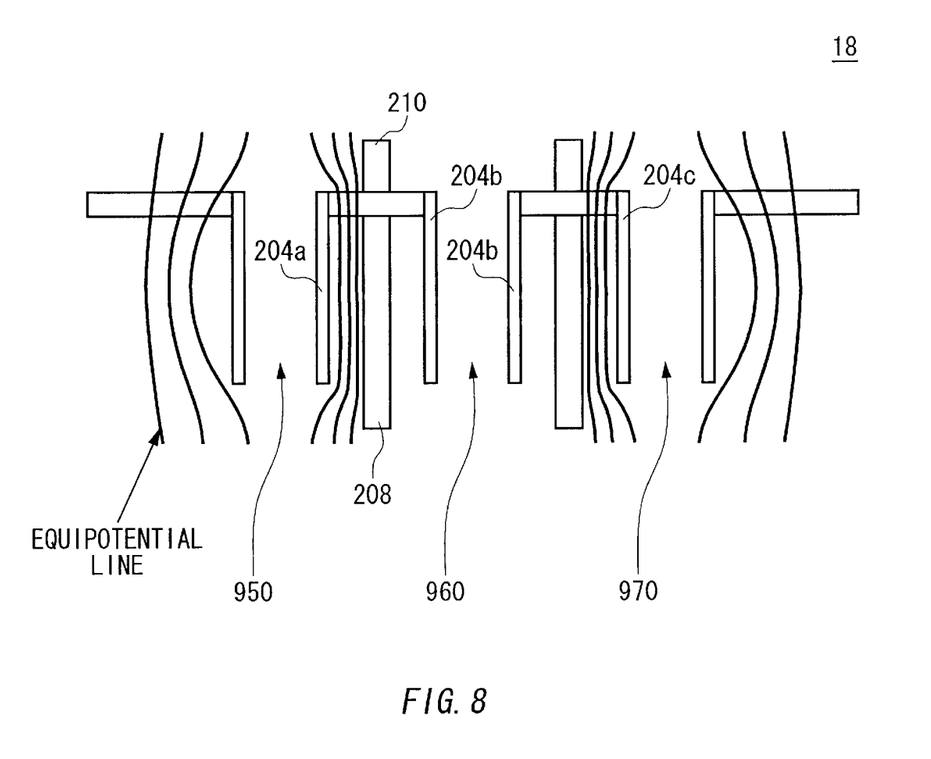
FIG. 8 is an example of an electric field formed by a plurality of deflectors in the first shaping/deflection section.

FIG. 8 shows an example of an electric field formed by the plurality of deflectors 204 in the first shaping/deflection section 18. According to the electron beam exposure apparatus 100 in the present embodiment, influence on the electron beams other than the electron beam which passes through the predetermined deflector by the electric field generated by the predetermined deflector is substantially reduced. For example, it is the case that negative voltage is applied to a deflecting electrode of the deflector 204a so that the electron beam which passes through the aperture 950 is deflected, positive voltage is applied to a deflecting electrode of the deflector 204c so that the electron beam which passes through the aperture 970 is deflected, and voltage is not applied to a deflecting electrode of the deflector 204b so that the electron beam which passes through the aperture 960 goes straight on. In this case, as shown in FIG. 8, the first screen electrode 208 and the second screen electrode 210 screen the electric field generated by the deflector 204a and the deflector 204c, so that the influence on the electron beam which passes through the deflector 204b due to the deflector 204a and deflector 204c is substantially reduced, and the plurality of electron beams are irradiated on the wafer accurately.

Figure 9:
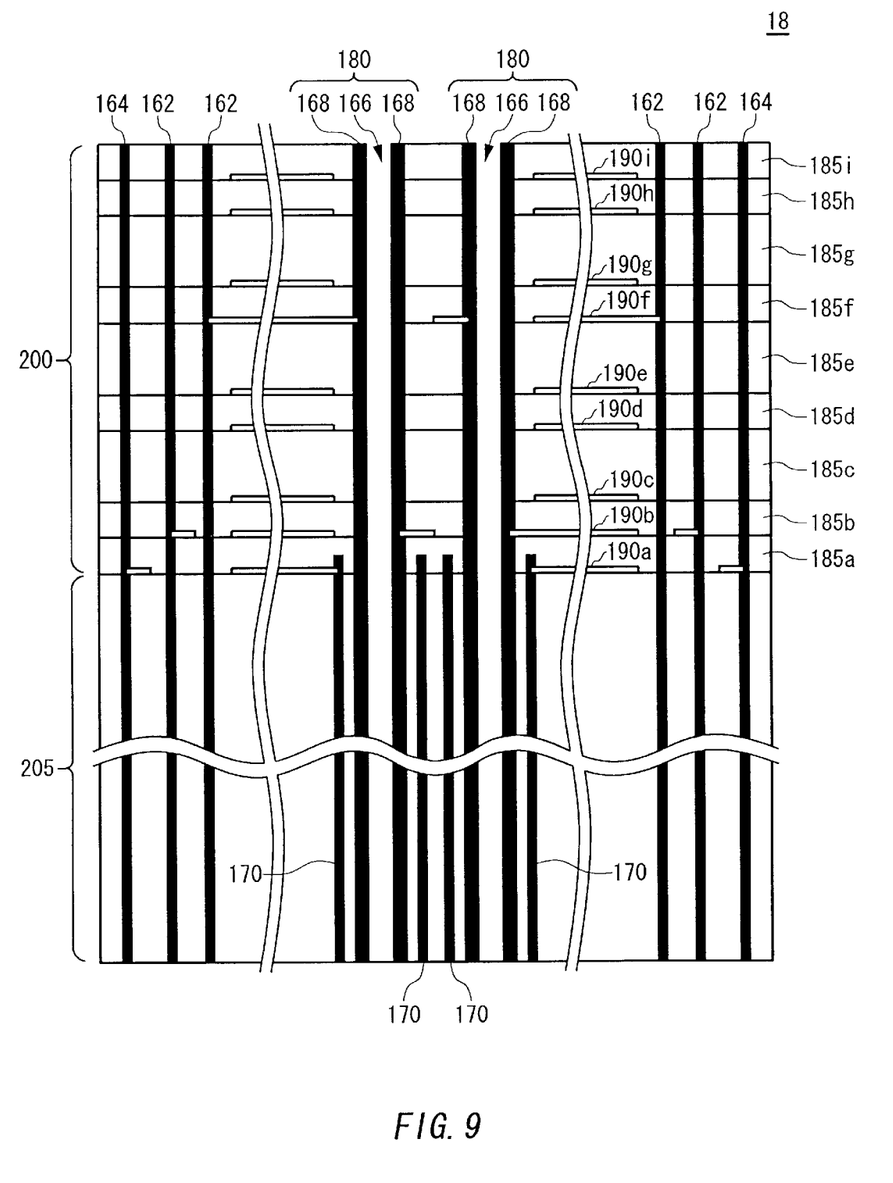
FIG. 9 is another example of the configuration of the first shaping/deflection section.

FIG. 9 is a view illustrating another examples of the configuration of the first shaping/deflection section 18. In this example, an interval between the adjoining electron beams is narrow. For example, the interval is selected so that all electron beams are provided within the area of one chip which is to be mounted on the wafer 44. Therefore, the first shaping/deflection section 18 according to this example includes a plurality of deflecting sections provided at very narrow interval. Moreover, the first shaping/deflection section 18 in this example is manufactured by semiconductor processing.

The first shaping/deflection section 18 according to this example includes: a plurality of deflecting sections 180 including a plurality of apertures 166 through which the electron beams pass, and a plurality of deflecting electrodes 168 for deflecting the passing electron beams; a plurality of screen electrodes 170, which are grounding electrodes, for screening the electric field generated between the plurality of deflecting sections; a plurality of deflecting electrode pads 162 for electrically connecting the shaping/deflection control section 84 (refer to FIG. 2) and the deflecting sections 180; a plurality of grounded screen-electrode pads 164; a first wiring layer 190a for electrically connecting the screen electrodes 170 and the screen-electrode pads 164; a second wiring layer 190b, a third wiring layer 190c, a fourth wiring layer 190d, a fifth wiring layer 190e, a sixth wiring layer 190f, a seventh wiring layer 190g, an eighth wiring layer 190h, and a ninth wiring layer 190i, for electrically connecting each of the plurality of deflecting electrodes 168, and each of the plurality of deflecting electrode pads 162; and a first insulating layer 185a, a second insulating layer 185b, a third insulating layer 185c, a fourth insulating layer 185d, a fifth insulating layer 185e, a sixth insulating layer 185f, a seventh insulating layer 185g, an eighth insulating layer 185h, and a ninth insulating layer 185i, for electrically insulating a wiring layer and another wiring layer. Each of the second insulating layer 185b, the fourth insulating layer 185d, and the sixth insulating layer 185f have a predetermined thickness, and thickness of each of the third insulating layer 185c, the fifth insulating layer 185e, and the seventh insulating layer 185g is thicker than the predetermined thickness.

All of the apertures 166 are equipped with the plurality of deflecting electrodes 168. It is preferable that length of the deflecting electrode pad 162 and the screen-electrode pad 164 is substantially equal to length of the deflecting electrode 168. It is also preferable that the first shaping/deflection section 18 includes the same number of the wiring layers as the number of the deflecting electrodes 168 included in the deflecting sections 180. It is also preferable that an area 200, in which the plurality of wiring layers and the insulating layers are provided, is substantially thinner than an area 205 in which the screen electrodes 170 are provided.

As it is obvious from the foregoing explanation, according to the electron beam exposure apparatus of the present invention, a plurality of electron beams are irradiated on a wafer accurately by screening the electric field generated between a plurality of deflectors.

Although the present invention has been described by way of exemplary embodiment, the scope of the present invention is not limited to the foregoing embodiment. Various modifications in the foregoing embodiment may be made when the present invention defined in the appended claims is enforced. It is obvious from the definition of the appended claims that embodiments with such modifications also belong to the scope of the present invention.

What is claimed is:

1. An electron beam exposure apparatus for exposing a pattern on a wafer by a plurality of electron beams, comprising:
  an electron beam generating section for generating the plurality of electron beams;
  a deflecting section comprising a plurality of deflectors for deflecting the plurality of electron beams respectively; and
  a screening section comprising a first screen electrode provided between said plurality of deflectors along an irradiation direction of said electron beam, wherein a distance between an upper end of said first screen electrode and said electron beam generating section is shorter than a distance between a distal end of said deflectors and said electron beam generating section, and a distance between a lower end of said first screen electrode and the wafer is shorter than a distance between the distal end of said deflectors and the wafer.

2. The electron beam exposure apparatus as claimed in claim 1, wherein said first screen electrode has a gridiron shape, where each of said plurality of deflectors are provided between bars of the grid.

3. The electron beam exposure apparatus as claimed in claim 1, wherein said first screen electrode is provided at circumference of each of said plurality of deflectors.

4. The electron beam exposure apparatus as claimed in claim 1, wherein said deflecting section is provided in a direction substantially perpendicular to the irradiation direction of said electron beams, and further comprises a deflector substrate at which said plurality of deflectors are provided, and said first screen electrode is attached on said deflector substrate.

5. The electron beam exposure apparatus as claimed in claim 4, wherein said first screen electrode is provided so that a distance between an upper end of said first screen electrode and said electron beam generating section is shorter than a distance between a distal end of said deflector and said electron beam generating section, and a distance between a lower end of said first screen electrode and the wafer 44 is shorter than a distance between the distal end of said deflectors and the wafer.

6. The electron beam exposure apparatus as claimed in claim 1, wherein said deflecting section is provided in a direction substantially perpendicular to the irradiation direction of the electron beam, and further comprises a deflector substrate at which said plurality of deflectors are provided, and said screening section is provided substantially parallel with said deflector substrate, and further comprises a first screening substrate on which said first screen electrode is attached.

7. The electron beam exposure apparatus as claimed in claim 6, wherein said screening section comprises:

a second screen electrode provided across said deflector substrate from said first screen electrode along the irradiation direction of the electron beams; and a second screening substrate provided across said deflector substrate from said first screening substrate in a direction substantially parallel with said deflector substrate, wherein said second screen electrode is attached on said second screening substrate.

8. The electron beam exposure apparatus as claimed in claim 1, wherein said first screen electrode comprises a plurality of apertures in a direction substantially perpendicular to the irradiation direction of the electron beams.

9. The electron beam exposure apparatus as claimed in claim 8, wherein said first screen electrode is a grid electrode.

10. The electron beam exposure apparatus as claimed in claim 1, further comprising an electron lens section for focusing the plurality of electron beams independently, wherein the electron lens section comprises:

a first magnetic conductor with a plurality of first apertures through which the plurality of electron beams pass; and a second magnetic conductor with a plurality of second apertures through which each of the plurality of electron beams, which has passed through each of said first apertures, passes, where said second magnetic conductor is provided substantially parallel with said first magnetic conductor, and said deflector is provided inside said first aperture, and said first screen electrode is provided between said first magnetic conductor and said second magnetic conductor.

11. The electron beam exposure apparatus as claimed in claim 1, further comprising an electron lens section for focusing the plurality of electron beams independently, wherein the electron lens section comprises:

a first magnetic conductor with a plurality of first apertures through which the plurality of electron beams pass; and a second magnetic conductor with a plurality of second apertures through which each of the plurality of electron beams, which has passed through each of said first apertures, passes, where said second magnetic conductor is provided substantially parallel with said first magnetic conductor, and said deflector is provided inside said first aperture, said first screen electrode is provided between said plurality of second apertures of said second magnetic conductor extending from said second magnetic conductor to a direction of the wafer, and said screening section further comprises:

a second screen electrode provided between said plurality of first apertures of said first magnetic conductor extending from said first magnetic conductor to a direction of said electron beam generating section; and a third screen electrode provided between said plurality of first apertures and between said first magnetic conductor and said second magnetic conductor, extending along the irradiation direction of said electron beams.

12. The electron beam exposure apparatus as claimed in claim 11, wherein said screening section comprises:

a first screening substrate, which is provided substantially parallel with said second magnetic conductor, on which said first screen electrode is attached; and a second screening substrate, which is provided substantially parallel with said first magnetic conductor, on which said second screen electrode is attached.

13. An electron beam deflection apparatus for independently deflecting a plurality of electron beams, comprising:

a substrate in which a plurality of apertures are provided;

a plurality of deflectors provided in each of said plurality of apertures of said substrate; and a first screen electrode provided between said plurality of apertures of said substrate.

14. The electron beam deflection apparatus as claimed in claim 13 wherein, said deflector is provided on said substrate and extending along a first direction which is a direction substantially perpendicular to said substrate, and said first screen electrode is provided on said substrate and extending along the first direction, wherein said first screen electrode is longer than said deflector.

15. The electron beam deflection apparatus as claimed in claim 14, further comprising a second screen electrode provided across said substrate from said first screen electrode along the first direction.

* * * * *